(12) United States Patent
Gabriel et al.

(10) Patent No.: US 11,821,923 B2
(45) Date of Patent: Nov. 21, 2023

(54) ARRANGEMENT AND SWITCHING DEVICE WITH CONTACTLESS CURRENT MEASURING CAPABILITY

(71) Applicant: Eaton Intelligent Power Limited, Dublin (IE)

(72) Inventors: Adam Gabriel, Horomerice (CZ); Jeremy Kramer, Prague (CZ); Tomas Drabek, Prague (CZ)

(73) Assignee: EATON INTELLIGENT POWER LIMITED, Dublin (IE)

( * ) Notice: Subject to any disclaimer, the term of this patent is extended or adjusted under 35 U.S.C. 154(b) by 107 days.

(21) Appl. No.: 17/460,377

(22) Filed: Aug. 30, 2021

(65) Prior Publication Data

US 2022/0065899 A1    Mar. 3, 2022

(30) Foreign Application Priority Data

Sep. 3, 2020   (GB) ...................................... 2013891

(51) Int. Cl.
  *G01R 15/20*       (2006.01)
  *H01H 9/02*        (2006.01)
(52) U.S. Cl.
  CPC ............. *G01R 15/202* (2013.01); *H01H 9/02* (2013.01)
(58) Field of Classification Search
  CPC ....... H01H 2009/02; H01H 2009/0235; H01H 2009/0257; H01H 2009/0285; H01H 2009/0292; H01H 2009/04; H01H 2009/06; H01H 2009/065; H01H 71/10; H01H 71/045; H01H 9/02; H01H 9/0214; H01H 9/0271; H01H 9/40; H01H 9/42; H01H 9/54; G01R 15/20; G01R 15/202

USPC .......................................................... 200/293
See application file for complete search history.

(56) References Cited

U.S. PATENT DOCUMENTS

| | | | |
|---|---|---|---|
| 5,150,057 A * | 9/1992 | Suptitz ................... | G01R 27/16 324/508 |
| 5,841,272 A | 11/1998 | Smith et al. | |
| 2008/0290974 A1* | 11/2008 | Adams ................ | F16K 37/0041 335/301 |
| 2009/0284248 A1* | 11/2009 | Etter ..................... | G01R 15/181 324/126 |
| 2013/0207640 A1* | 8/2013 | Hammond ............. | G01R 33/07 324/117 R |

FOREIGN PATENT DOCUMENTS

| | | |
|---|---|---|
| EP | 0359886 A1 | 3/1990 |
| JP | H1073619 A | 3/1998 |

* cited by examiner

*Primary Examiner* — Anthony R Jimenez
(74) *Attorney, Agent, or Firm* — LEYDIG, VOIT & MAYER, LTD.

(57) ABSTRACT

A current measuring arrangement includes a first electrical conductor having a first resistance and a second electrical conductor switched in parallel and having a second, higher resistance, wherein both the first resistance and the second resistance are each below 0.1Ω. The arrangement further includes a hall sensor, which is prepared to measure a current through the second electrical conductor, and a calculation unit, which is connected to the hall sensor and which is designed to calculate a total current through the first electrical conductor and the second electrical conductor based on the current measured by the hall sensor. A switching device provides a comparable functionality.

14 Claims, 6 Drawing Sheets

ARRANGEMENT AND SWITCHING DEVICE WITH CONTACTLESS CURRENT MEASURING CAPABILITY

CROSS-REFERENCE TO PRIOR APPLICATION

Priority is claimed to British Patent Application No. GB 2013891.3, filed on Sep. 3, 2020, the entire disclosure of which is hereby incorporated by reference herein.

FIELD

The invention relates to current measuring arrangements.

BACKGROUND

Generally, current measuring arrangements and switching device are known. There are also known various methods and arrangements for current measuring. However, there is missing a possibility for contactless measurement of high currents.

SUMMARY

In an embodiment, the present invention provides a current measuring arrangement, comprises a first electrical conductor having a first resistance, a second electrical conductor, which is switched in parallel with the first electrical conductor and which has a second, higher resistance, wherein the first resistance and the second resistance each are below $0.1\Omega$ between connection points between the first electrical conductor and the second electrical conductor. The current measuring arrangement further comprises a hall sensor, which is prepared to measure a current through the second electrical conductor, and a calculation unit, which is connected to the hall sensor and which is designed to calculate a total current through the first electrical conductor and the second electrical conductor based on the current measured by the hall sensor and based on a ratio between the first resistance and the second resistance or based on a ratio between the total resistance, which is the sum of the first resistance and the second resistance, and the second resistance.

BRIEF DESCRIPTION OF DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
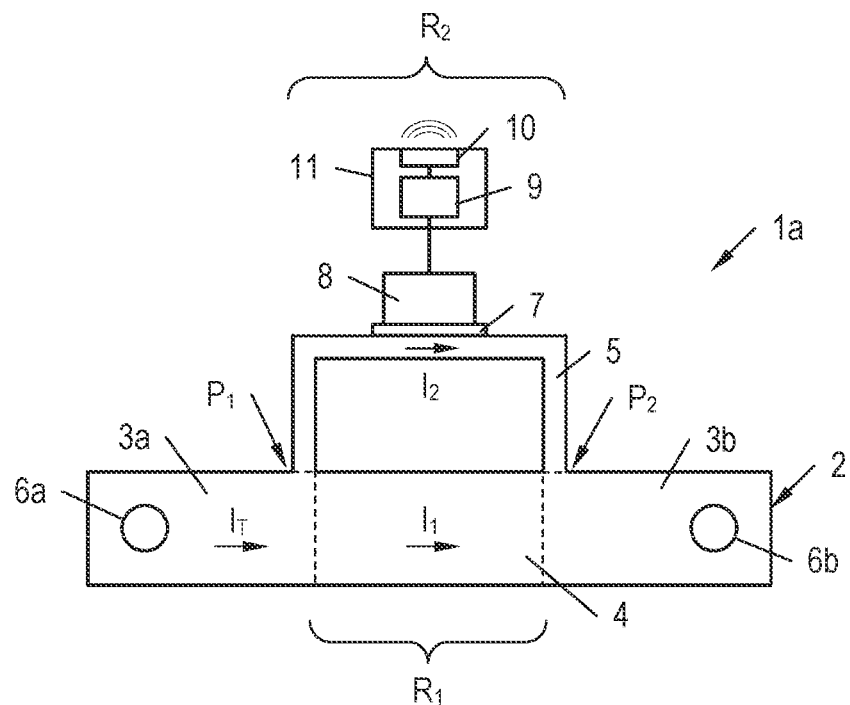
FIG. 1 shows a first example of an arrangement for measuring a current.

The present invention relates to a current measuring arrangement, comprising a first electrical conductor having a first resistance and a second electrical conductor, which is switched in parallel with the first electrical conductor and which has a second, higher resistance. Both the first resistance and the second resistance each are below $0.1\Omega$ between connection points between the first electrical conductor and the second electrical conductor. Furthermore, the invention relates to a switching device, which comprises a housing, two main terminals reaching through the housing and a conductive main current path, which connects the two main terminals within the housing. The main current path comprises a first electrical conductor having a first resistance, and the switching device comprises a switch arranged in the main current path.

In an embodiment of the invention, a current measuring arrangement comprises a first electrical conductor having a first resistance, a second electrical conductor, which is switched in parallel with the first electrical conductor and which has a second, higher resistance, wherein the first resistance and the second resistance each are below $0.1\Omega$ between connection points between the first electrical conductor and the second electrical conductor, and a hall sensor, which is prepared to measure a current through the second electrical conductor, and a calculation unit, which is connected to the hall sensor and which is designed to calculate a total current through the first electrical conductor and the second electrical conductor based on the current measured by the hall sensor and based on a ratio between the first resistance and the second resistance or based on a ratio between the total resistance, which is the sum of the first resistance and the second resistance, and the second resistance.

In another embodiment, the present invention provides a switching device comprising: a housing, two main terminals reaching through the housing, a main current path, which connects the two main terminals within the housing and which comprises a first electrical conductor having a first resistance, a switch arranged in the main current path, a second electrical conductor, which is switched in parallel to the first electrical conductor and which has a second, higher resistance, and a hall sensor, which is prepared to measure a current through the second electrical conductor, wherein the first resistance and the second resistance each are below $0.1\Omega$ between connection points between the first electrical conductor and the second electrical conductor.

Beneficially, the switching device can be embodied as a circuit breaker, which is a switching device with trigger unit automatically triggering the switch in a fault condition, e.g. in case of overcurrent or in case of a fault current.

In particular, the switching device may also comprise a calculation unit, which is connected to the hall sensor and which is designed to calculate a total current through the first electrical conductor and the second electrical conductor based on the current measured by the hall sensor and based on a ratio between the first resistance and the second resistance or based on a ratio between the total resistance, which is the sum of the first resistance and the second resistance, and the second resistance.

In this case, the switching device can be seen as comprising an arrangement of the aforementioned kind, which is arranged in the main current path within the housing. However, the calculation unit may also be an external calculation unit, which is arranged out of the housing and even at a distance from the switching device.

When a voltage is applied between connection points between the first electrical conductor and the second electrical conductor, a current $I_1$ flows trough first electrical conductor, and a current $I_2$ flows through the second electrical conductor, wherein a total current $I_T$ is the sum of both. As generally known the relation between the currents is $I_T=I_1+I_2$ and $I_1 \cdot R_1=I_2 \cdot R_2$ in the arrangement defined above. The total current $I_T$ can be calculated by calculating the current $I_1=I_2 \cdot R_2/R_1$ and by subsequently calculating $I_T=I_1+I_2$ or by directly calculating $I_T=I_2 \cdot (R1+R_2)/R_1$ or by $I_T=I_2 \cdot (1+R_2/R_1)$.

The result, i.e. the value of the total current $I_T$ can be communicated to a receiving party via a wired or wireless data interface, which is connected to the calculation unit and which can also be part of the above arrangement or the above switching device. The calculation unit and the data interface together can form an processing unit.

The sum of the first resistance $R_1$ and the second resistance $R_2$ in the given context may also denoted as "parallel sum".

By these measures, a device for contactless measurement of high currents is provided. Advantageously, the current through the second electrical conductor can be kept small so that the magnetic field and hence the signal to be measured by the hall sensor are also comparably small. In this way, the limited measuring range of a hall sensor can be expanded, and comparably small hall sensors can be used for measuring high currents.

Generally, the hall sensor can be arranged a) on or near to the second electrical conductor or b) in an air gap of an annular magnetic core around the second electrical conductor or c) in an air gap of an annular magnetic core around which the second electrical conductor is wound or d) on or near an open, non-annular magnetic core around which the second electrical conductor is wound.

"Near to" in the above context in particular means that at least 95% of the magnetic field, which the hall sensor measures, originates from the second electrical conductor.

By using a magnetic core, a magnetic flux caused by the current through the second electrical conductor is concentrated within the magnetic core. Hence, an influence on the hall sensor caused by interfering magnetic fields can be kept low so that the measurement is not deteriorated by those interfering magnetic fields. In particular, an influence from an interfering magnetic field caused by the current through the first electrical conductor is thereby kept low.

By winding the second electrical conductor around the magnetic core, the magnetic flux in the annular magnetic core and thus the signal measured by the hall sensor can be increased compared to embodiments without such windings. Accordingly, provided the same sensitivity of the hall sensor, the current through the second electrical conductor can be lowered by the use of windings compared to embodiments without such windings.

The air gap of the annular magnetic core can be filled out by the hall sensor, or there may also be an additional "true" air gap.

Further advantageous embodiments are disclosed in the claims and in the description as well as in the figures.

Preferably, an insulation between the second electrical conductor and conducting structures of the hall sensor (and also to the connection to the calculating unit and to conducting structures of the calculation unit) is designed to operate at least until a voltage of 1 kV or withstand at least a voltage of 1 kV. In this way, the risk for a flashover from the second electrical conductor to the calculation unit, the data interface and electronic circuits connected thereto is very low.

In another preferred embodiment, the first electrical conductor and the second electrical conductor are embodied as a single piece. In particular, the first electrical conductor and the second electrical conductor can be made of a one-piece metal bar. So, the first electrical conductor and the second electrical conductor are easy to produce, for example by punching or laser cutting the desired shape out of a metal sheet material. But it is also beneficial if the second electrical conductor is made of or comprises a wire, in particular a stranded wire. In this way, the arrangement provides enhanced flexibility with regards to where the hall sensor can be arranged in relation to the first electrical conductor. Generally, the first and the second electrical conductor can be made from copper, steel, aluminum, brass or another metal alloy.

Advantageously, a magnetic shielding is arranged around the hall sensor. Hence, a magnetic field interfering with the magnetic field originating from the current through the second electrical conductor is kept away from the hall sensor so that the measurement is not deteriorated by those interfering magnetic fields. In particular, an interfering magnetic field caused by the current through the first electrical conductor is thereby kept away from the hall sensor. Of course, a magnetic shielding shall not derogate a magnetic field in the magnetic cores of the cases b) to d) mentioned hereinbefore which originates from the current through the second electrical conductor.

Preferably, a quotient Q between the second resistance $R_2$ and the first resistance $R_1$ is greater than 2. In other words that means $Q=R_2/R_1>2$ and $R_1<0.5 \cdot R_2$. Firstly, this choice reduces the operational requirements of the hall sensor meaning that its measuring range can be comparably low and it can be smaller. Secondly, this choice diminishes power consumption of $R_2$ and heating up the same. To even increase these benefits, the quotient Q can also be greater than 5 or even greater than 10.

In an advantageous embodiment of the switching device, the hall sensor is arranged within the housing. Hence, the switching device and the hall sensor form an integrated solution. In addition, the calculation unit and also the data interface can be arranged within the housing. However, the calculation unit and/or the data interface can also be arranged out of the housing. Moreover, the hall sensor and also the calculation unit and also the data interface can be detachably connected to the housing. In that, switching devices can be retrofitted with a current sensing device, comprising the hall sensor, the calculation unit and the data interface if desired.

In another advantageous embodiment of the switching device, the second electrical conductor is lead through the housing and the hall sensor is arranged out of the housing. In particular, the second electrical conductor can comprise a first part and a second part, wherein the first part of the second electrical conductor can be detachably connected to secondary terminals of the switching device, which are electrically connected to the second parts of the second electrical conductor within the housing. In addition, the hall sensor and also the calculation unit and also the data interface can be detachably connected to the housing. That also means that the calculation unit and also the data interface can be arranged out of the housing, too. Beneficially, also this embodiment provides retrofitting switching devices with a current sensing device, comprising the hall sensor, the calculation unit and the data interface if desired. In particular, the hall sensor or the current sensing device can be embodied as plug-in device or plug-on device.

In yet another advantageous embodiment of the switching device, the second electrical conductor is lead to the housing and runs near to or within the housing in a contactless region and the hall sensor is arranged out of the housing in this contactless region. Beneficially, the second electrical conductor runs in parallel to an outer border of the housing in the contactless region. This embodiment takes advantage of the contactless measuring capability of the hall sensor. Hence, the second electrical conductor needs not to be lead through the housing and there is no need for secondary terminals, which generally involve the risk of electrical shocks if they are not covered properly when no current sensing device is attached to the switching device. The embodiment in question does not need such a cover and hence is particularly safe. In addition to the hall sensor, the calculation unit and the data interface can be arranged out of the housing, too. In particular, the hall sensor and also the calculation unit and also the data interface can be detachably connected to the housing. In that, switching devices again can be retrofitted with a current sensing device, comprising the hall sensor, the calculation unit and the data interface if desired.

It should be noted at this point that the various embodiments of the disclosed arrangement and the advantages resulting thereof similarly apply to the disclosed switching device and vice versa.

Referring now to the figures, generally, same parts or similar parts are denoted with the same/similar names and reference signs. The features disclosed in the description apply to parts with the same/similar names respectively reference signs. Indicating the orientation and relative position (up, down, sideward, etc.) is related to the associated figure, and indication of the orientation and/or relative position has to be amended in different figures accordingly as the case may be.

FIG. 1 shows a first example of an arrangement 1a for measuring a current. The arrangement 1a comprises a metal bar 2, which has common electrical conductors 3a, 3b, a first electrical conductor 4 and a second electrical conductor 5. The first electrical conductor 4 is switched in parallel with the second electrical conductor 5, and both are connected to each other at connection points $P_1$, $P_2$. In the example shown in FIG. 1, the metal bar 2 is one-piece and the common electrical conductors 3a, 3b, the first electrical conductor 4 and a second electrical conductor 5 are sections thereof.

The first electrical conductor 4 has a first resistance $R_1$, and the second electrical conductor 5 has a second, higher resistance $R_2$, wherein the first resistance $R_1$ and the second resistance $R_2$ each are below 0.1Ω between connection points $P_1$, $P_2$ between the first electrical conductor 4 and the second electrical conductor 5.

The metal bar 2 comprises optional mounting holes 6a, 6b, by which the arrangement 1a can be switched into an electric circuit.

The arrangement 1a furthermore comprises a hall sensor 8, which is mounted to the second electrical conductor 5 with an insulation 7 in-between. Further on, the arrangement 1a comprises a calculation unit 9, which is connected to the hall sensor 8 at an input side and which is connected to a wireless data interface 10 on its output side. The calculation unit 9 and the wireless data interface 10 together form a processing unit 11.

When the arrangement 1a is switched into an electric circuit or strictly speaking when a voltage is applied between the common electrical conductors 3a, 3b, a total current $I_T$ flows through the common electrical conductors 3a, 3b, a current $I_1$ flows trough first electrical conductor 4, and a current $I_2$ flows through the second electrical conductor 5. As generally known the relation between the currents is $I_T=I_1+I_2$ and $I_1 \cdot R_1 = I_2 \cdot R_2$.

The hall sensor 8 measures the current $I_2$ through the second electrical conductor 5, and the calculation unit 9 calculates the total current $I_T$ through the first electrical conductor 4 and the second electrical conductor 5 based on the current $I_2$ measured by the hall sensor 8 and based on a ratio between the first resistance $R_1$ and the second resistance $R_2$ or based on a ratio between the total resistance, which is the sum of the first resistance $R_1$ and the second resistance $R_2$, and the second resistance $R_2$. In math language this means that the total current $I_T$ can be calculated by calculating the current $I_1=I_2 \cdot R_2/R_1$ and by subsequently calculating $I_T=I_1+I_2$ or by directly calculating $I_T=I_2 \cdot (1+R_2/R_1)$.

The result, i.e. the value of the total current $I_T$ can be communicated to a receiving party via the wireless data interface 10. However, using a wired data interface would be applicable as well.

It is advantageous, if a quotient Q between the second resistance $R_2$ and the first resistance $R_1$ is greater than 2. In other words that means $Q=R_2/R_1>2$ and $R_1<0.5 \cdot R_2$. Firstly, this choice reduces the operational requirements of the hall sensor 8 meaning that its measuring range can be comparably low and it can be smaller. Secondly, this choice diminishes power consumption of $R_2$ and heating up the same. To even increase these benefits, the quotient Q can also be greater than 5 or even greater than 10.

An advantage of using the arrangement 1a for measuring the total current $I_T$ is that comparably large currents can be measured with high accuracy and with having galvanic separation. Preferably, the insulation 7 between the second electrical conductor 5 and conducting structures of the hall sensor 8 is designed to operate until or withstand at least a voltage of 1 kV. The same counts for the connection to the calculation unit 9 and to conducting structures of the calculation unit 9, which are preferably designed to withstand at least an insulation voltage of 1 kV as well.

Figure 2:
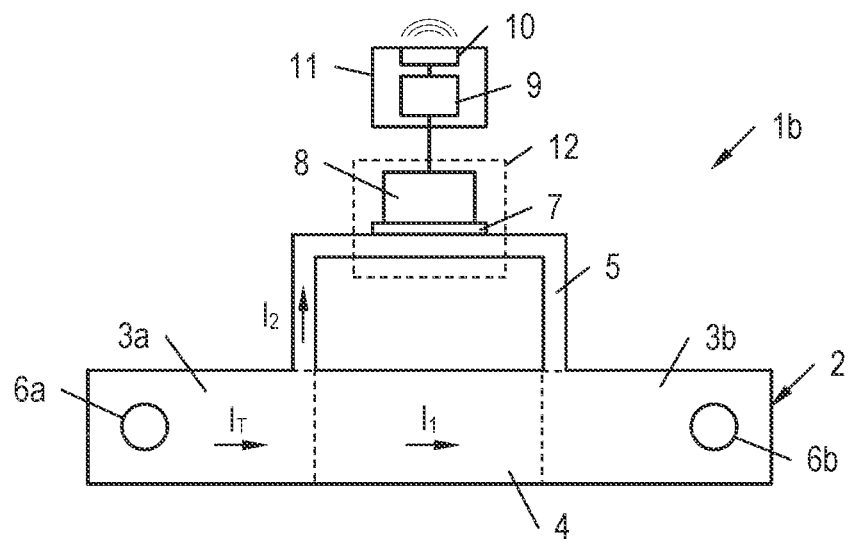
FIG. 2 shows an example of an arrangement for measuring a current with a magnetic shielding.

FIG. 2 shows a second embodiment of an arrangement 1b for measuring a current, which is similar to the arrangement 1a shown in FIG. 1. In contrast, a magnetic shielding 12 is arranged around the hall sensor 8. Advantageously, a magnetic field interfering with the magnetic field originating from the current $I_2$ through the second electrical conductor 5 is kept away from the hall sensor 8 so that the measurement is not deteriorated by those interfering magnetic fields. In particular, an interfering magnetic field caused by the current $I_1$ through the first electrical conductor 4 is thereby kept away from the hall sensor 8.

Figure 3:
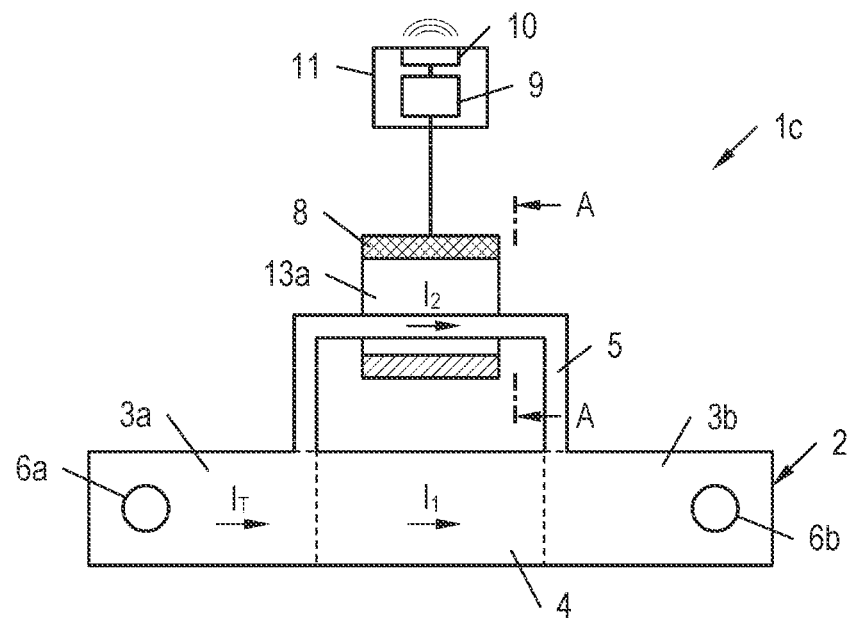
FIG. 3 shows an example of an arrangement for measuring a current with a annular magnetic core around the second electrical conductor.
Figure 4:
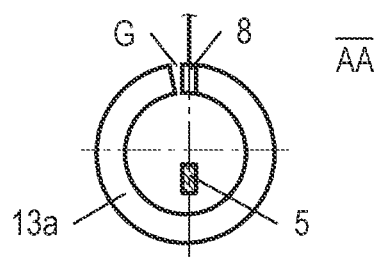
FIG. 4 shows a side view of FIG. 3 in the plane AA.

FIG. 3 shows another embodiment of an arrangement 1c for measuring a current, which is similar to the arrangement 1a shown in FIG. 1. In contrast, an annular magnetic core 13a surrounds the second electrical conductor 5, and the hall sensor 8 is located in an air gap G of this annular magnetic core 13a. FIG. 4 shows a side view of the arrangement 1c of FIG. 3 in the plane AA. In this embodiment, a magnetic flux caused by the current $I_2$ through the second electrical conductor 5 is concentrated within the annular magnetic core 13a. Hence, an influence on the hall sensor 8 caused by interfering magnetic fields can be kept low so that the measurement is not deteriorated by those interfering magnetic fields as well.

Figure 5:
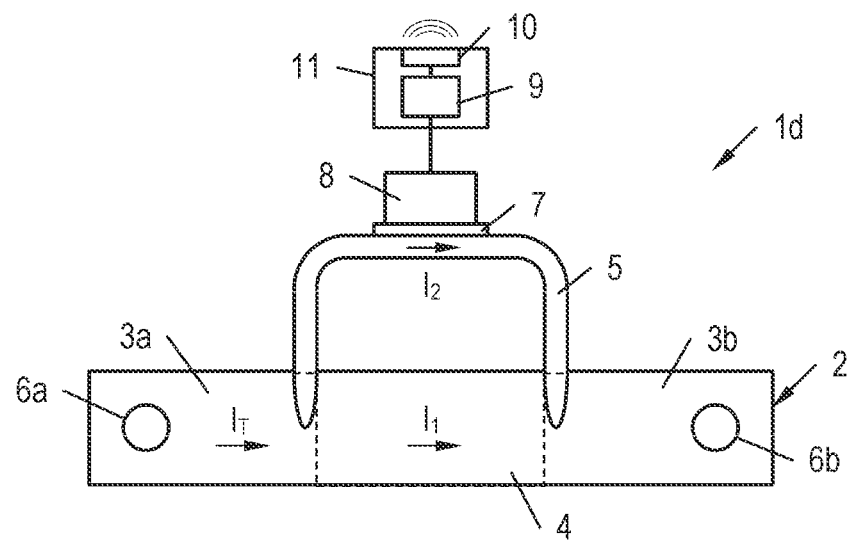
FIG. 5 shows an example of an arrangement for measuring a current with a second electrical conductor being embodied as a wire.

FIG. 5 shows another embodiment of an arrangement 1d for measuring a current, which is similar to the arrangement 1a shown in FIG. 1. In contrast, the second electrical conductor 5 is made of or comprises a wire, in particular a stranded wire. So, the arrangement 1d provides enhanced flexibility with regards to where the hall sensor 8 can be arranged in relation to the first electrical conductor 4. The wire can be welded or soldered to the metal bar 2.

Figure 6:
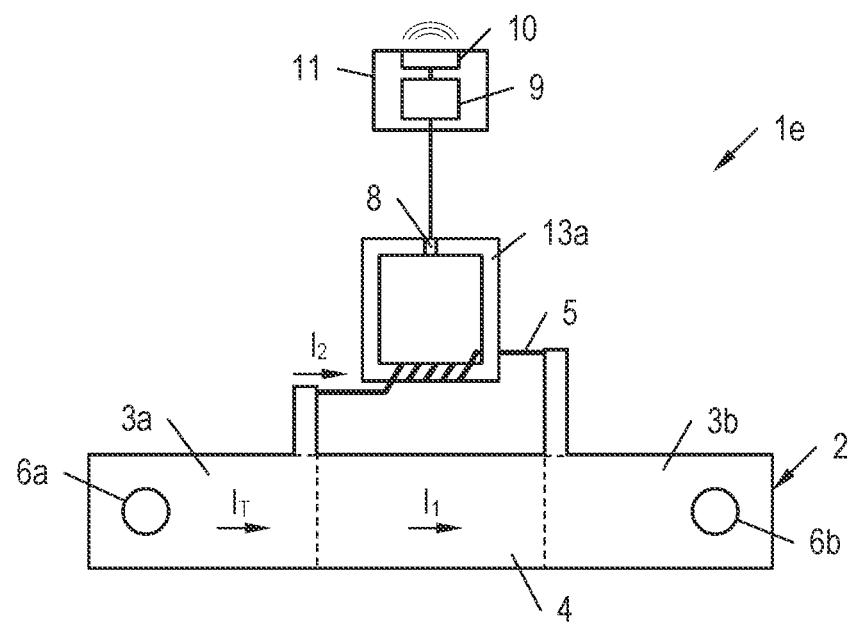
FIG. 6 shows an example of an arrangement for measuring a current, wherein the second electrical conductor is wound around an annular magnetic core.

FIG. 6 shows another embodiment of an arrangement 1e for measuring a current, which is similar to the arrangement 1c shown in FIGS. 3 and 4. In contrast, the second electrical conductor 5 is wound around an annular magnetic core 13a, wherein the hall sensor 8 again is located in an air gap G of this annular magnetic core 13a. By these measures, the magnetic flux in the annular magnetic core 13a and thus the signal measured by the hall sensor 8 can be increased compared to the magnetic flux and the signal provided by the arrangement 1c of FIGS. 3 and 4. Accordingly, provided the same sensitivity of the hall sensor 8, the current $I_2$ through the second electrical conductor 5 can be lowered in the arrangement 1e compared to the arrangement 1c.

Generally, an air gap G of the annular magnetic core 13a can be filled out by the hall sensor 8 like this is depicted in FIG. 5, or there may also be an additional "true" air gap like this is depicted in FIGS. 3 and 4.

Figure 7:
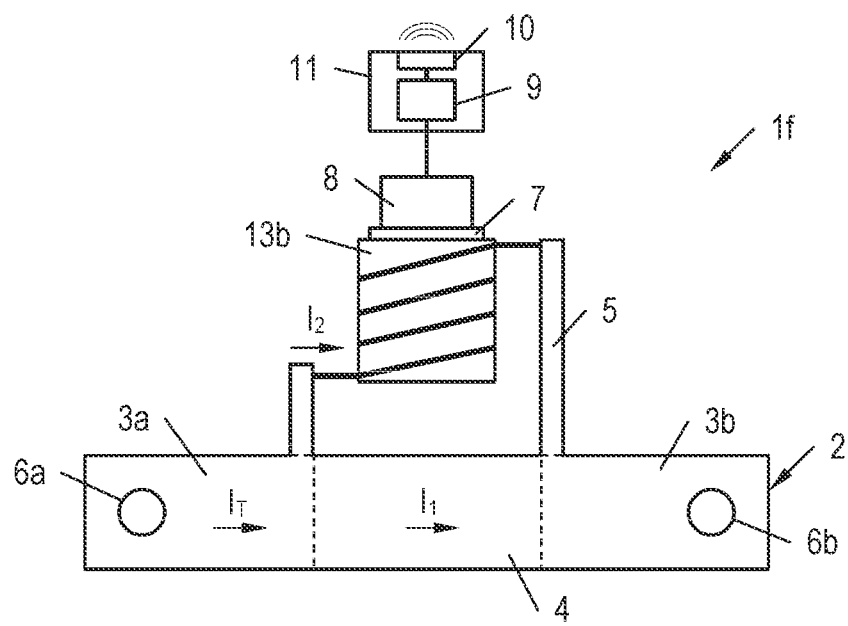
FIG. 7 shows an example of an arrangement for measuring a current, wherein the second electrical conductor is wound around a non-annular magnetic core.

FIG. 7 shows another embodiment of an arrangement if for measuring a current, which is similar to the arrangement 1e shown in FIG. 5. In contrast, the second electrical conductor 5 is not wound around an annular magnetic core 13a, but around an open, non-annular magnetic core 13b. The hall sensor 8 is arranged on the non-annular magnetic core 13b like this is depicted in FIG. 6 or near to the non-annular magnetic core 13b. Again, a magnetic flux caused by the current $I_2$ through the second electrical conductor 5 is guided in the magnetic core 13b. That is why an influence of interfering magnetic fields again can be kept low so that the measurement is not deteriorated by those interfering magnetic fields.

Generally, a magnetic core 13a, 13b, in addition to the advantages noted above, helps to increase the distance of the hall sensor 8 from the first electrical conductor 4 what reduces an influence of the current $I_1$ trough first electrical conductor 4 on the measurement of the hall sensor 8, too, and also enhances design freedom.

Concluding, the hall sensor 8 can be arranged:
a) on or near to the second electrical conductor 5 (see FIGS. 1, 2 and 5) or
b) in an air gap G of an annular magnetic core 13a around the second electrical conductor 5 (see FIGS. 3 and 4) or
c) in an air gap G of an annular magnetic core 13a around which the second electrical conductor 5 wound (see FIG. 6) or d) on or near an open, non-annular magnetic core 13b around which the second electrical conductor 5 wound (see FIG. 7).

"Near to" in the above context in particular means that at least 95% of the magnetic field, which the hall sensor 8 measures, originates from the current $I_2$ through the second electrical conductor 5.

Figure 8:
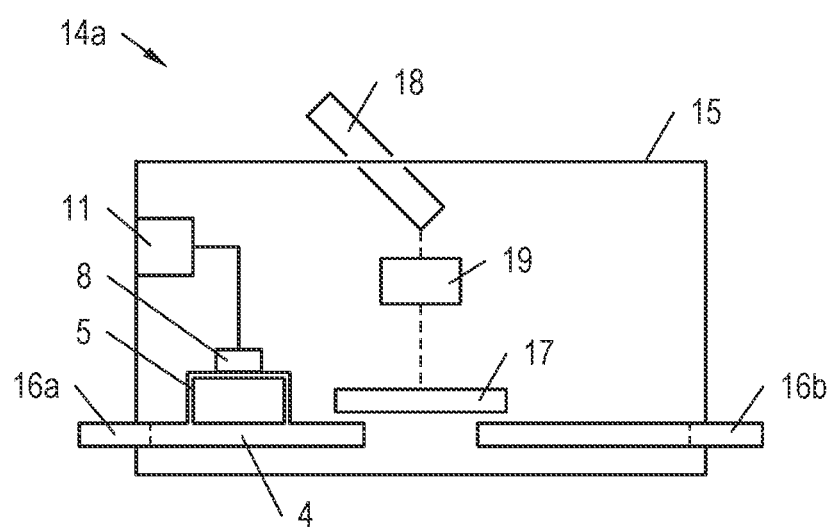
FIG. 8 shows a first example of an arrangement of a switching device with current measuring capability.

Based on the above advantages, the arrangements 1a . . . 1f particularly qualify for an use in a switching device and more particularly for a use in a switching device, which is embodied as a circuit breaker. FIG. 8 shows a first embodiment of a switching device 14a, which comprises a housing 15, two main terminals 16a, 16b reaching through the housing 15 and a (conductive) main current path, which connects the two main terminals 16a, 16b within the housing 15. Furthermore, the switching device 14a comprises a switch 17 arranged in the main current path. A lever 18 and a trigger unit 19 are connected to the switch 17 to operate the same manually and automatically in an overcurrent situation as is generally known.

Further on, the main current path comprises a first electrical conductor 4 having a first resistance $R_1$. A second electrical conductor 5 is switched in parallel to the first electrical conductor 4 and has a second, higher resistance $R_2$. The switching device 14a also comprises a hall sensor 8, which is prepared to measure a current $I_2$ through the second electrical conductor 5. Again, the first resistance $R_1$ and the second resistance $R_2$ are each are below 0.1Ω between connection points $P_1$, $P_2$ between the first electrical conductor 4 and the second electrical conductor 5.

In particular, like this is the case in FIG. 8, the switching device 14a can comprise a calculation unit 9 which is connected to the hall sensor 8 and which is designed to calculate a total current $I_T$ through the first electrical conductor 4 and the second electrical conductor 5 based on the current $I_2$ measured by the hall sensor 8 and based on a ratio between the first resistance $R_1$ and the second resistance $R_2$ or based on a ratio between the total resistance, which is the sum of the first resistance $R_1$ and the second resistance $R_2$, and the second resistance $R_2$.

In the embodiment of FIG. 8, the hall sensor 8 is arranged within the housing 15. In addition, the calculation unit 9 and also the data interface 10 is arranged within the housing 15 in FIG. 8. Such a switching device 14a then can be seen as comprising an arrangement 1a . . . 1f according to the examples disclosed hereinbefore, which is arranged in the main current path within the housing 15. However, the hall sensor 8 of the switching device 14a can also be connected to an external calculation unit 9 and communicate with the same by wire or wirelessly.

Generally, as this is outlined in the following examples, the hall sensor 8, the calculation unit 9 and the data interface 10 can be arranged out of the housing 15. In particular, the hall sensor 8 and also the calculation unit 9 and also the data interface 10 can be detachably connected to the housing 15.

Figure 9:
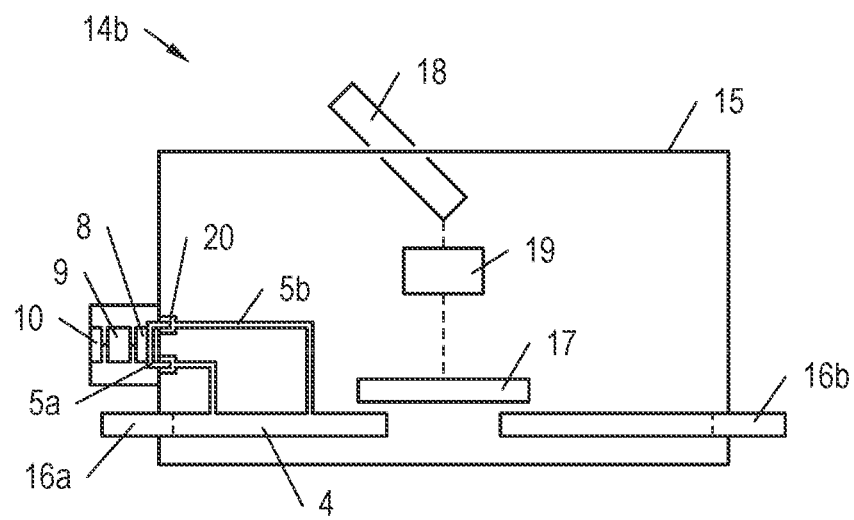
FIG. 9 shows an example of an arrangement of a switching device with a plug-in current measuring device.

FIG. 9 shows another embodiment of a switching device 14b, which is similar to the switching device 14a shown in FIG. 8. In contrast, here the second electrical conductor comprises a first part 5a and a second part 5b. The first part 5a of the second electrical conductor is detachably connected to secondary terminals 20, which are electrically connected to the second parts 5b of the second electrical conductor within the housing 15. The hall sensor 8 is arranged out of the housing 15. The calculation unit 9 and also the data interface 10 are arranged out of the housing 15, too. So, the second electrical conductor 5a, 5b is lead through the housing 15 in this example. In particular, the hall sensor 8 and also the calculation unit 9 and also the data interface 10 can be detachably connected to the housing 15 as this is depicted in FIG. 9. In that, switching devices 14b can be retrofitted with a current sensing device, comprising the hall sensor 8, the calculation unit 9 and the data interface 10, if desired.

Figure 10:
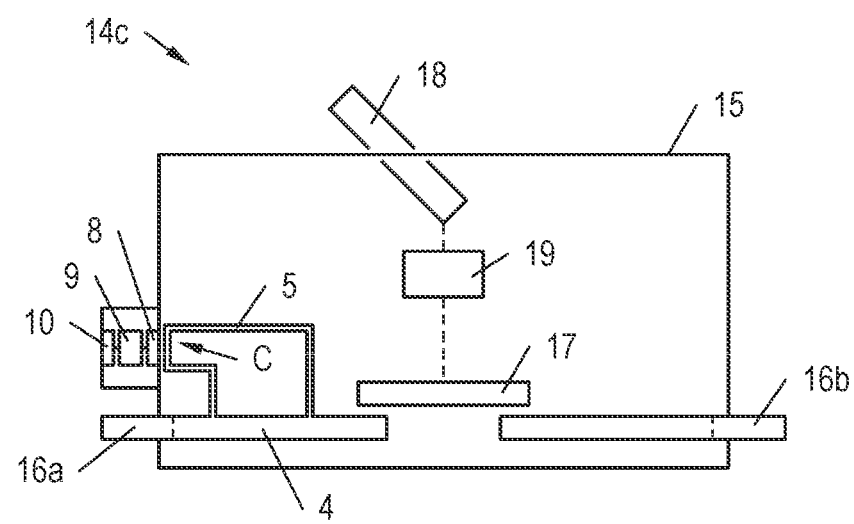
FIG. 10 shows an example of an arrangement of a switching device with a contactless measuring region.

FIG. 10 shows another embodiment of a switching device 14c, which is similar to the switching device 14b shown in FIG. 9. In contrast, the second electrical conductor 5 is lead to the housing 15 and runs near to or within the housing 15 in a contactless region C, and the hall sensor 8 is arranged out of the housing 15 in this contactless region C. Beneficially, the second electrical conductor 5 runs in parallel to an outer border of the housing 15 in the contactless region C like this is depicted in FIG. 10. Again, the hall sensor 8, the calculation unit 9 and also the data interface 10 are arranged out of the housing 15, and again it is advantageous if the hall sensor 8, the calculation unit 9 and also the data interface 10 are detachably connected to the housing 15. Hence, switching devices 14c can be retrofitted with a current sensing device, comprising the hall sensor 8, the calculation unit 9 and the data interface 10, if desired, too. The embodiment shown in FIG. 10 takes advantage of the contactless measuring capability of the hall sensor 8. Hence, the second electrical conductor 5 needs not to be lead through the housing 15 and there is no need for secondary terminals 20, which generally involve the risk of electrical shocks if they are not covered properly when no current sensing device is attached to the switching device 14b. The embodiment of FIG. 10 does not need such a cover and hence is particularly safe.

Figure 11:
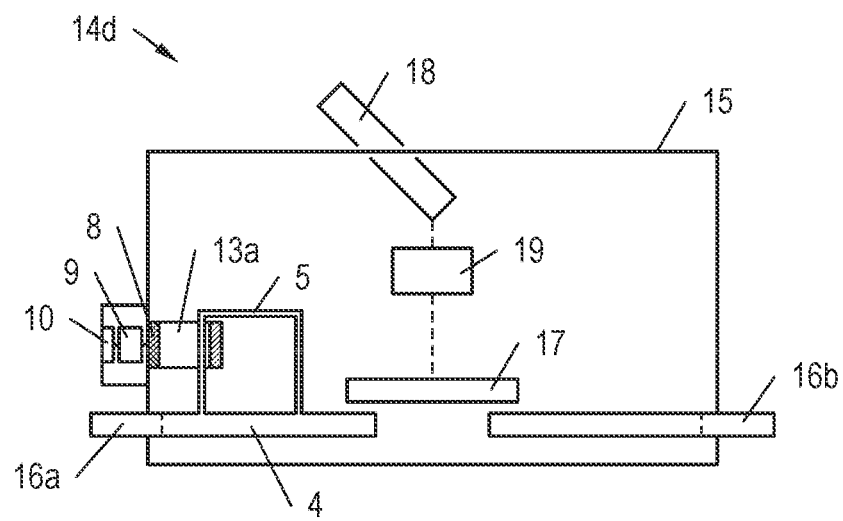
FIG. 11 shows an example of an arrangement of a switching device with an annular magnetic core and FIG. 12 shows an example of an arrangement of a switching device with a non-annular magnetic core.

FIG. 11 shows another embodiment of a switching device 14d, which is similar to the switching device 14c shown in FIG. 10. In contrast, an annular magnetic core 13a around the second electrical conductor 5 is used to guide the magnetic flux, which is caused by a current $I_2$ in the second electrical conductor 5, to the hall sensor 8. The hall sensor 8 is arranged in a gap G in the annular magnetic core 13a, just like it is the case in the example shown in FIGS. 3 and 4. So, the working principle and the advantages resulting thereof disclosed for the arrangement 1c of FIGS. 3 and 4 are applicable to the switching device 14d of FIG. 11 equivalently. It should be noted, that the housing 15 can fully enclose the annular magnetic core 13a, meaning that the hall sensor 8 is positioned in a groove of the housing 15 which is located in the air gap G of the annular magnetic core 13a. So, this embodiment is another example which is particularly useful for retrofitting a switching device 14d with a current sensing device, comprising the hall sensor 8, the calculation unit 9 and the data interface 10, if desired. Again, the switching device 14d shown in FIG. 11 takes advantage of the contactless measuring capability of the hall sensor 8, and again there is no need to lead the second electrical conductor 5 through the housing 15 and no need for secondary terminals 20. Thus, the switching device 14d is particularly safe as well.

It should also be noted that it is possible to wind the second electrical conductor 5 around the annular magnetic core 13a like this is shown for the arrangement 1e of FIG. 6. Accordingly, the working principle and the advantages resulting thereof disclosed for the arrangement 1e shown in FIG. 6 are applicable to a switching device 14d of FIG. 11 modified in this way equivalently.

Figure 12:
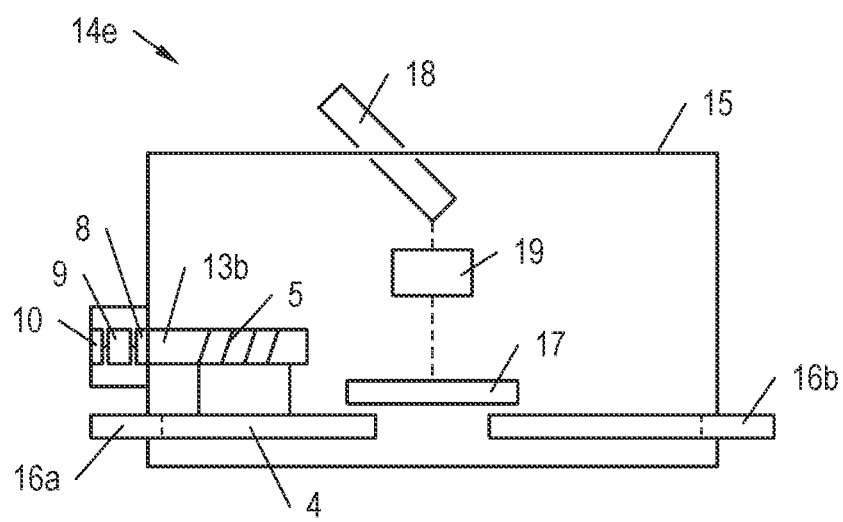

FIG. 12 shows another embodiment of a switching device 14e, which is similar to the switching device 14d shown in FIG. 11. In contrast, an open, non-annular magnetic core 13b is used, around which the second electrical conductor 5 is wound. So, again the magnetic flux, which is caused by a current $I_2$ in the second electrical conductor 5, is guided to the hall sensor 8. The working principle and the advantages resulting thereof disclosed for the arrangement if shown in FIG. 7 are applicable to the switching device 14e of FIG. 12 equivalently. It should be noted that again the housing 15 can fully enclose the annular magnetic core 13b, meaning that the hall sensor 8 is positioned out of the housing 15. So, this embodiment is another example which is particularly useful for retrofitting a switching device 14e with a current sensing device, comprising the hall sensor 8, the calculation unit 9 and the data interface 10, if desired. Again, the switching device 14e shown in FIG. 12 takes advantage of the contactless measuring capability of the hall sensor 8, and again there is no need to lead the second electrical conductor 5 through the housing 15 and no need for secondary terminals 20. Thus, the switching device 14e is particularly safe as well.

The hall sensor 8 in a switching device 14a . . . 14e can be arranged:

a) on or near to the second electrical conductor 5 (see FIGS. 8, 9 and 10 particularly in combination with FIGS. 1, 2 and 5) or b) in an air gap G of an annular magnetic core 13a around the second electrical conductor 5 (see FIG. 11 particularly in combination with FIGS. 3 and 4) or c) in an air gap G of an annular magnetic core 13a around which the second electrical conductor 5 wound (refer to FIG. 11 in combination with FIG. 6) or d) on or near an open, non-annular magnetic core 13b around which the second electrical conductor 5 wound (see FIG. 12 particularly in combination with FIG. 7).

Furthermore, it is noted that the invention is not limited to the embodiments disclosed hereinbefore, but combinations of the different variants are possible. In reality, the arrangements 1a . . . 1f and the switching devices 14a . . . 14e may have more or less parts than shown in the figures. The arrangements 1a . . . 1f and the switching devices 14a . . . 14e as well as parts thereof may also be shown in different scales and may be bigger or smaller than depicted. Finally, the description may comprise subject matter of further independent inventions.

It should also be noted that the term "comprising" does not exclude other elements and the use of articles "a" or "an" does not exclude a plurality. Also, elements described in association with different embodiments may be combined. It should also be noted that reference signs in the claims should not be construed as limiting the scope of the claims.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

1a . . . 1f arrangement
2 metal bar
3a, 3b common electrical conductor
4 first electrical conductor
5, 5a, 5b second electrical conductor
6a, 6b mounting hole
7 insulation
8 hall sensor
9 calculation unit
10 wireless data interface
11 processing unit
12 magnetic shielding
13a, 13b magnetic core
14a . . . 14e switching device/circuit breaker
15 housing
16a, 16b main terminal
17 switch
18 lever
19 trigger unit
20 secondary terminal
C contactless region
G air gap
$P_1$, $P_2$ connection point
$R_1$, $R_2$ resistance
$I_1$ (first) current trough first electrical conductor
$I_2$ (second) current trough second electrical conductor
$I_T$ total current

What is claimed is:

1. A current measuring arrangement, comprising:
a first electrical conductor having a first resistance;
a second electrical conductor, which is switched in parallel with the first electrical conductor and which has a second, higher resistance, wherein the first resistance and the second resistance each are below 0.1 Q between connection points between the first electrical conductor and the second electrical conductor;
a hall sensor, which is configured to measure a current through the second electrical conductor; and
a calculation unit, which is connected to the hall sensor and which is configured to calculate a total current through the first electrical conductor and the second electrical conductor based on the current measured by the hall sensor and based on a ratio between the first resistance and the second resistance or based on a ratio between the total resistance, which is the sum of the first resistance and the second resistance, and the second resistance,
wherein the hall sensor is arranged:
in an air gap of an annular magnetic core around which the second electrical conductor is wound, or
on or near an open, non-annular magnetic core around which the second electrical conductor is wound.

2. The current measuring arrangement as claimed in claim 1, wherein an insulation between the second electrical conductor and conducting structures of the hall sensor is designed to operate until or withstand at least a voltage of 1 kV.

3. The current measuring arrangement as claimed in claim 1, wherein the first electrical conductor and the second electrical conductor are embodied as a single piece.

4. The current measuring arrangement as claimed in claim 1, comprising a magnetic shielding around the hall sensor.

5. The current measuring arrangement as claimed in claim 1, comprising a wired or wireless data interface connected to the calculation unit.

6. The current measuring arrangement as claimed in claim 1, wherein a quotient Q between the second resistance and the first resistance is greater than 2.

7. The A switching device, comprising:
a housing;
two main terminals reaching through the housing;
a main current path connecting the two main terminals within the housing;
a switch in the main current path; and
the current measuring arrangement according to claim 1 arranged in the main current path within the housing.

8. A switching device, comprising;
a housing;
two main terminals reaching through the housing;
a main current path, which connects the two main terminals within the housing and which comprises a first electrical conductor having a first resistance;
a switch arranged in the main current path;
a second electrical conductor, which is configured to be switched in parallel to the first electrical conductor and which has a second, higher resistance;
a hall sensor, which is configured to measure a current through the second electrical conductor; and
a trigger unit,
wherein the first resistance and the second resistance each are below 0.1 Q between connection points between the first electrical conductor and the second electrical conductor, and
wherein the trigger unit is configured to cause the switch to open when the hall sensor detects a current above a predetermined threshold, thereby breaking the main current path and electrically disconnecting the two main terminals from each other.

9. The switching device as claimed in claim 8, comprising a calculation unit which is connected to the hall sensor and which is configured to calculate a total current through the first electrical conductor and the second electrical conductor based on the current measured by the hall sensor and based on a ratio between the first resistance and the second resistance or based on a ratio between the total resistance, which is the sum of the first resistance and the second resistance, and the second resistance.

10. The switching device as claimed in claim 8, wherein the hall sensor is arranged:
a) on or near to the second electrical conductor, or
b) in an air gap of an annular magnetic core around the second electrical conductor, or
c) in an air gap of an annular magnetic core around which the second electrical conductor is wound, or
d) on or near an open, non-annular magnetic core around which the second electrical conductor is wound.

11. The switching device as claimed in claim 8, wherein the hall sensor is arranged within the housing.

12. The switching device as claimed in claim 8, wherein the second electrical conductor is lead through the housing and the hall sensor is arranged out of the housing.

13. The switching device as claimed in claim 8, wherein the second electrical conductor is lead to the housing and runs near to or within the housing in a contactless region and the hall sensor is arranged out of the housing in this contactless region.

14. The switching device as claimed in claim 8, wherein the switching device is embodied as a circuit breaker.

* * * * *